United States Patent
Funk

(10) Patent No.: US 7,098,157 B2
(45) Date of Patent: Aug. 29, 2006

(54) METHOD AND APPARATUS FOR THERMALLY TREATING DISK-SHAPED SUBSTRATES

(75) Inventor: Klaus Funk, Ottobrunn (DE)

(73) Assignee: Mattson Thermal Products GmbH, Dornstadt (DE)

( * ) Notice: Subject to any disclaimer, the term of this patent is extended or adjusted under 35 U.S.C. 154(b) by 0 days.

(21) Appl. No.: 10/540,614

(22) PCT Filed: Nov. 28, 2003

(86) PCT No.: PCT/EP03/13388

§ 371 (c)(1),
(2), (4) Date: Jun. 23, 2005

(87) PCT Pub. No.: WO2004/059695

PCT Pub. Date: Jul. 15, 2004

(65) Prior Publication Data

US 2006/0115968 A1    Jun. 1, 2006

(30) Foreign Application Priority Data

Dec. 23, 2002  (DE) ................. 102 60 672

(51) Int. Cl.
*H01L 21/00* (2006.01)
*F26B 4/04* (2006.01)

(52) U.S. Cl. ............... 438/800; 34/413; 429/4
(58) Field of Classification Search ........... 438/800; 34/412
See application file for complete search history.

(56) References Cited

U.S. PATENT DOCUMENTS

| | | | |
|---|---|---|---|
| 4,958,061 A | 9/1990 | Wakabayashi et al. | |
| 4,962,330 A * | 10/1990 | Lierke et al. | 310/323.19 |
| 5,810,155 A * | 9/1998 | Hashimoto et al. | 198/630 |
| 6,284,051 B1 | 9/2001 | Fidelman | |
| 6,410,888 B1 | 6/2002 | Pan | |
| 6,717,112 B1 | 4/2004 | Probst | |
| 6,770,146 B1 * | 8/2004 | Koren et al. | 118/730 |
| 6,800,833 B1 * | 10/2004 | Gregor et al. | 219/390 |
| 2002/0102098 A1 | 8/2002 | Camm et al. | |
| 2002/0116836 A1 | 8/2002 | Morad et al. | |

FOREIGN PATENT DOCUMENTS

DE    36 08 783    9/1987

(Continued)

OTHER PUBLICATIONS

Puu-An Juang et al., "Vibration Characteristic Identification by Experiment of a New Disc-Type Ultrasonic Stator", Institute of Physics, Journal of Micromechanica Microengineering, vol. 12, pp. 598-603, 2002.*
T. Otsuka et al, "Consideration of Sample Dimension for Ultrasonic Levitation", IEEE Ultrasonic Symposium, pp. 1271-1274, 1990.*

(Continued)

*Primary Examiner*—W. David Coleman
(74) *Attorney, Agent, or Firm*—Dority & Manning, P.A.

(57) ABSTRACT

A method and apparatus for thermally treating disk-shaped substrates, especially semiconductor wafers, in a rapid heating unit having at least one first radiation source, which is spaced from a given substrate for heating the substrate. The substrate is heated in a heating phase and is cooled in a cooling phase that follows the heating phase. During at least a portion of the cooling phase, the substrate is supported at a distance of from 50 μm to 1 mm via ultrasonic levitation from a heating/cooling plate. For example by means of an ultrasonic electrode.

67 Claims, 6 Drawing Sheets

FOREIGN PATENT DOCUMENTS

| | | |
|---|---|---|
| DE | 199 16 872 | 4/1999 |
| DE | 199 05 524 | 9/2000 |
| JP | 61001017 | 6/1984 |
| JP | 11301832 | 11/1999 |
| JP | 59215718 | 5/2005 |
| WO | WO 00/46840 | 8/2000 |
| WO | WO 00/61474 | 10/2000 |
| WO | WO 02/090222 | 11/2002 |
| WO | WO 03/076313 | 9/2003 |

OTHER PUBLICATIONS

Sadayuki Ueha "Recent Development of Ultrasonic Actuators", IEEE Ultrasonic Symposium, pp. 513-520, 2001.*
Article "Holding characteristics of . . . "—Matsuo.
Article "A Multi-Transducer Newr"—Amano.

* cited by examiner

METHOD AND APPARATUS FOR THERMALLY TREATING DISK-SHAPED SUBSTRATES

This specification for the instant application should be granted the priority date of Dec. 23, 2002, the filing date of the corresponding German patent application 102 60 672.2 as well as the priority date of Nov. 28, 2003, the filing date of the corresponding International patent application PCT/EP2003/013388.

BACKGROUND OF THE INVENTION

The present invention relates to a method and an apparatus for thermally treating disk-shaped substrates, especially semiconductor wafers, in a rapid heating unit having at least one first radiation source, which is spaced from the substrate, for heating at least one substrate, whereby the substrate is heated in a heating phase and is cooled in a subsequent cooling phase.

Various methods and apparatus of this type are known in the semiconductor industry. Rapid heating units, which are also known as RTP units (Rapid Thermal Processing units) can have various constructions in order to bring semiconductor wafers to temperatures over 300° C. within very short time periods, and to subsequently again cool them.

With one known RTP unit, a semiconductor wafer is vertically moved up and down in a process chamber by a mechanical handling mechanism, whereby within the process chamber a radially symmetrical and vertically changing temperature field that is constant over time is provided. This permits a rapid heating of the wafer to the desired temperature. However, there is the problem of achieving homogeneous temperatures over the wafer over time, since with this type of apparatus no compensation possibilities are provided for temperature inhomogeneities over the wafer.

With an alternative RTP unit, the semiconductor wafers are heated by radiation sources, especially halogen lamps and/or arc lamps. One example of such an RTP unit is described in applicant's DE 199 05 524 A. With this RTP unit, semiconductor wafers are transported into a process chamber having upper and lower quartz walls, and are placed upon quartz pins within the process chamber. Heating of the substrate is effected by heating lamps, such halogen lamps, that are disposed above and below the process chamber and that are respectively arranged in upper and lower banks of lamps. By appropriate control of the lamps of the upper and lower bank of lamps, temperature inhomogeneities over the surface of the substrate can be well compensated for. Furthermore, the quartz lamps enable a high heating rate of the wafer.

However, this known unit has the problem that the wafers are placed upon substrate pins, as a result of which scratches can result in the surface of the wafer during heating and expansion of the wafer. Furthermore, localized temperature gradients occur at or in the vicinity of the support points. As a result, so-called dislocations or dislocation lines result in the crystalline structure of the semiconductor wafer, and can adversely affect the function of the wafer.

Furthermore, the known units have the problem that, although they enable a rapid heating of the wafer, no cooling is possible at the same rate. This is due to the fact that the cooling of the wafer is essentially effected only via thermal radiation emitted from the wafer. Although it would be conceivable to at least partially achieve a cooling by a gas stream within the process chamber, this has the inherent problem that the gas stream can produce temperature inhomogeneities over the surface of the substrate.

It is therefore an object of the present invention to enable a rapid cooling of substrates in a rapid heating unit. Furthermore, it is also an object of the present invention to eliminate the problems resulting from support elements.

SUMMARY OF THE INVENTION

Pursuant to the invention, the object of the invention is realized by a method of the aforementioned type in that during at least a portion of the cooling phase, the substrate is held at a distance of between 50 µm and 1 mm from a heating/cooling plate. Due to the closeness of the substrate to the heating/cooling plate, there results a heat conductance between them that enables a higher cooling rate of the substrate. Since the substrate is held at a distance, no contact points result between them that can lead to the aforementioned shortcomings. The distance is preferably between 150 and 500 µm.

Pursuant to a particularly preferred embodiment of the invention, the substrate is supported in the rapid heating unit by ultrasonic levitation during the thermal treatment. The ultrasonic levitation enables a non-contact support of the substrate, and furthermore enables the support of the substrate at a distance between 50 µm and 1 mm, especially between 150 and 500 µm. The heating/cooling plate preferably has a first ultrasonic electrode, so that the ultrasonic levitation, and the adjustment of the distance, can be effected by the heating/cooling plate. In this connection, the first ultrasonic electrode has at least one flat radiation surface that essentially corresponds to the shape and size of the substrate, so that the entire surface of a substrate is supported at an essentially uniform distance, and a uniform cooling of the substrate is also possible over its entire surface.

Pursuant to one embodiment of the invention, the first ultrasonic electrode has at least one radiation surface that is inclined relative to the flat radiation surface, and by means of which the substrate is held in a prescribed lateral position. The inclined radiation surface in particular enables a centering of a substrate relative to the flat radiation surface.

Pursuant to a further embodiment of the invention, at least one second ultrasonic electrode is provided that is angled relative to the first ultrasonic electrode and/or is movable relative thereto. As a consequence of the angled second ultrasonic electrode, a lateral positioning of the substrate can again be undertaken. Due to the movable ultrasonic electrode, it is possible to move the substrate relative to the heating/cooling plate and to alter the distance between heating/cooling plate and substrate during the thermal treatment. The substrate is preferably held in a prescribed lateral position by the second ultrasonic electrode.

Pursuant to a particularly preferred embodiment of the invention, the substrate is held at a greater distance relative to the heat sink (preferably greater than 500 µm) during the heating phase in order to keep the thermal losses in this phase low, and then during an initial portion of the cooling phase holding the distance of the wafer between 50 µm and 1 mm, in particular between 150 and 500 µm from the heating/cooling plate, and during the following portion of the cooling phase holding the substrate at a greater distance relative to the heating/cooling plate. This enables a controllable, initial rapid cooling of the substrate via heat conductance, followed by a less rapid cooling phase via thermal radiation emitted from the substrate. In this way a preferred cooling profile can be set. For a cooling that is as efficient and rapid as possible, the substrate is spaced from the heating/cooling plate by a distance of between 50 μm and 1 mm, in particular between 150 and 500 μm, until it has essentially reached the temperature of the heating/cooling plate. In this connection, the heating/cooling plate preferably has a thermal mass that is considerably greater than that of the substrate so that the temperature of the heating/cooling plate is essentially not affected by the heat absorbed by the substrate. The transverse conductivity of the heat can, by suitable selection, produce a desired temperature profile; in particular, a high thermal conductivity or a high temperature homogeneity can be ensured.

Pursuant to a preferred embodiment of the invention, the temperature of the heating/cooling plate is controlled in order in this way to enable a prescribed heating/cooling profile.

To enable heating of both sides of the substrate via spaced radiation sources, the heating/cooling plate is preferably essentially transparent for the radiation of the radiation source. To achieve an efficient cooling, the heating/cooling plate is, in contrast, essentially opaque for thermal radiation originating from the substrate.

Pursuant to an embodiment of the invention, at least one second radiation source is provided on that side of the heating/cooling plate facing away from the substrate, whereby the heating/cooling plate is essentially opaque for the radiation of the second radiation source, and the heating/cooling plate is heated at least partially during the thermal treatment by the second radiation source. This enables a heating of the heating/cooling plate in order to bring it to a prescribed temperature. During the heating of the substrate, this enables a heating via the heating/cooling plate, which is advantageous since semiconductor wafers, depending upon their configuration, are frequently essentially transparent below a temperature of 600° C. for the radiation sources, such as halogen lamps, that are used. In this connection, the second radiation source preferably has a different wavelength from the first radiation source in order, if necessary, to enable the heating/cooling plate to be transparent to radiation originating from the first radiation source in order to act directly upon the substrate.

Pursuant to an alternative embodiment of the invention, the heating/cooling plate has at least one chamber for receiving a fluid that can be used either for heating and/or cooling the heating/cooling plate. In particular during an initial portion of the heating phase, a fluid that absorbs the radiation of the first radiation source is introduced into the heating/cooling plate in order to heat the heating/cooling plate. If it is desirable for the radiation originating from the first radiation source to act directly upon the substrate, a fluid that is transparent for the radiation is introduced into the heating/cooling plate. This allows the transparency of the heating/cooling plate to be varied in a desired manner during the thermal treatment of the substrate. In this connection, the respective fluid can be statically held within the heating/cooling plate, or it can be constantly conveyed therethrough, and in particular especially for cooling the heating/cooling plate if it is necessary to do so.

In order to also efficiently use the heating/cooling plate during the heating phase, the at least one substrate is supported at a distance from the heating/cooling plate at least during a portion of the heating phase at a distance between 50 μm and 1 mm, in particular between 150 and 500 μm. In this connection, the at least one substrate is preferably supported at a distance from the heating/cooling plate during an initial portion of the heating phase at a distance of between 50 μm and 1 mm, in particular between 150 and 500 μm, and during the following portion of the heating phase is supported from the heating/cooling plate at a greater distance. As a result, during the initial portion a rapid heating is possible at least partially via heat conductance, whereby during the following portion a heating is made possible exclusively via the radiation of the radiation sources, which, in a known manner, have a higher dynamic.

To homogenize the temperature of the substrate over its entire surface, the substrate is rotated at least during portions of the thermal treatment. In this connection, the substrate is preferably rotated via a rotating noise field in order to enable a non-contact rotation.

Pursuant to an alternative embodiment of the invention, the substrate is rotated by rotation of the heating/cooling plate and/or by rotation of at least one ultrasonic electrode, whereby the rotation of the heating/cooling plate and/or of the ultrasonic electrode also effects the rotation of the substrate, even if they are not in direct contact.

Pursuant to a further alternative embodiment, the substrate is rotated by a gas stream directed thereon in order to again enable a non-contact rotation.

The object of the invention is also realized by a method of the aforementioned type in that during the thermal treatment, the substrate is supported in the rapid heating unit via ultrasonic levitation. The sole use of ultrasonic levitation enables a non-contact support, as a result of which the problems that result from a contact support are avoided.

Pursuant to a preferred embodiment of the invention, the distance between a first ultrasonic electrode and the substrate is altered during the thermal treatment in order to vary a thermal coupling between the ultrasonic electrode and a substrate during the thermal treatment pursuant to prescribed process parameters.

The aforementioned methods and various embodiments can preferably be freely combined with one another in order to obtain a desired configuration.

The object of the invention is realized by an apparatus for the thermal treatment of disk-shaped substrate, especially semiconductor wafers, in a rapid heating unit having at least one first radiation source, spaced from the substrate, for heating at least one substrate in that at least one first ultrasonic electrode for the non-contact support of the substrate in the rapid heating unit is provided. The provision of an ultrasonic electrode enables the non-contact support of substrates in a rapid heating unit, and thus prevents the problems that result from contact elements during heating.

The first ultrasonic electrode preferably has at least one flat radiation surface that corresponds to the shape and size of the substrate in order to support the substrate in a laminar manner. Furthermore, localized temperature inhomogeneities in the substrate are prevented since the ultrasonic electrode extends over the entire substrate.

To enable a non-contact support of the substrate that is as close as possible, a control device is preferably provided for operating the first ultrasonic electrode in the short-range field. If the first ultrasonic electrode is operated in the short-range field, the distance between substrate and ultrasonic electrode can be set so low that with available atmospheric units or units in the sub-atmospheric region, a heat conductance is possible between them without producing an actual contact. Such a heat conductance can offer the advantages mentioned above with reference to the method, in particular during a cooling phase and/or a heating phase. In this connection, the first ultrasonic electrode preferably forms a heating/cooling plate, or it is in thermally conductive contact with a heating/cooling plate, whereby the heating/cooling plate has a thermal mass that is considerably greater than that of the substrate. In this way, the heating/ cooling profile of the substrate can be advantageously influenced during a thermal treatment. The first ultrasonic electrode is preferably a coating of the heating/cooling plate.

Pursuant to one embodiment of the invention, the first ultrasonic electrode has at least one radiation surface that is inclined relative to the flat radiation surface and that enables a lateral positioning of the substrate.

Pursuant to a further embodiment of the invention, at least one second ultrasonic electrode, which is angled and/or movable relative to the first ultrasonic electrode, is provided. The angled ultrasonic electrode enables a lateral positioning, and by providing a movable ultrasonic electrode the distance between substrate and first ultrasonic electrode can be adjusted in a straightforward manner in order to alter the thermal coupling between them.

The second ultrasonic electrode preferably has a ring-shaped form, whereas with an alternative embodiment at least three second ultrasonic electrodes are disposed on a circular line. Both embodiments enable a centering of the substrate in a simple and economical manner. With the embodiment having at least three second ultrasonic electrodes disposed on a circular line, these electrodes are preferably movable radially relative to a center point of the circular line and/or vertically in order in this manner to enable a change of the height of the substrate within a process chamber.

At least one ultrasonic electrode is advantageously disposed on a compensation ring that radially surrounds the substrate in order during the thermal treatment to provide a temperature compensation in the rim regions of the substrate. In this connection, the ultrasonic electrode is preferably inclined relative to a plane of the compensation ring in order to achieve a centering of the substrate relative to the compensation ring.

Pursuant to one embodiment of the invention, a device is provided for controlling the temperature of the heating/cooling plate in order by means of the heating/cooling plate to achieve a heating/cooling of the substrate in a desired manner in addition to the radiation sources.

The heating/cooling plate is preferably essentially transparent for the radiation of the radiation source in order not to adversely affect the radiation field of the radiation source and hence the dynamic connected therewith. In this connection, however, the heating/cooling plate is preferably essentially opaque for the thermal radiation originating from the substrate in order in particular during a cooling phase to absorb this radiation and enable a rapid cooling of the substrate.

Pursuant to an embodiment of the invention, for controlling the temperature of the heating/cooling plate at least one second radiation source is provided on that side of the heating/cooling plate that faces away from the substrate, whereby the heating/cooling plate is essentially opaque for the radiation of the second radiation source. In this connection, the second radiation source preferably has a different wavelength than does the first radiation source, so that the heating/cooling plate can be essentially transparent for the radiation of the first radiation source.

Pursuant to a further embodiment of the invention, the heating/cooling plate has at least one chamber for the introduction of the heating/cooling fluid. In this connection, a control device for the selective introduction of different heating/cooling fluids is furthermore preferably provided, whereby at least one cooling fluid is transparent for the radiation originating from one of the radiation sources, while a second heating/cooling fluid is opaque for radiation originating from one of the radiation sources.

The apparatus preferably has a device for generating a rotational impulse for the substrate in order to rotate the latter during the thermal treatment. In this connection, pursuant to one embodiment of the invention the device is provided with a control mechanism for producing a rotating sound field and/or a device for rotation of the heating/cooling plate, or at least one of the ultrasonic electrodes, about a prescribed point of rotation, and/or at least a gas nozzle directed onto the substrate.

The present invention is particularly suitable for a thermal treatment of semiconductor wafers, whereby radiation sources for heating the semiconductor wafer are disposed on both sides of the semiconductor wafer. However, it is also possible to utilize the principles of the present invention with a rapid heating unit where a heating of the substrate is effected by radiation sources disposed on only one side, or with a system where the substrate is treated by vertical displacement in an oven having different temperatures at different levels.

The invention will subsequently be explained in greater detail with the aid of preferred embodiments of the invention with reference to the drawings, in which:

DESCRIPTION OF SPECIFIC EMBODIMENTS

Figure 1:
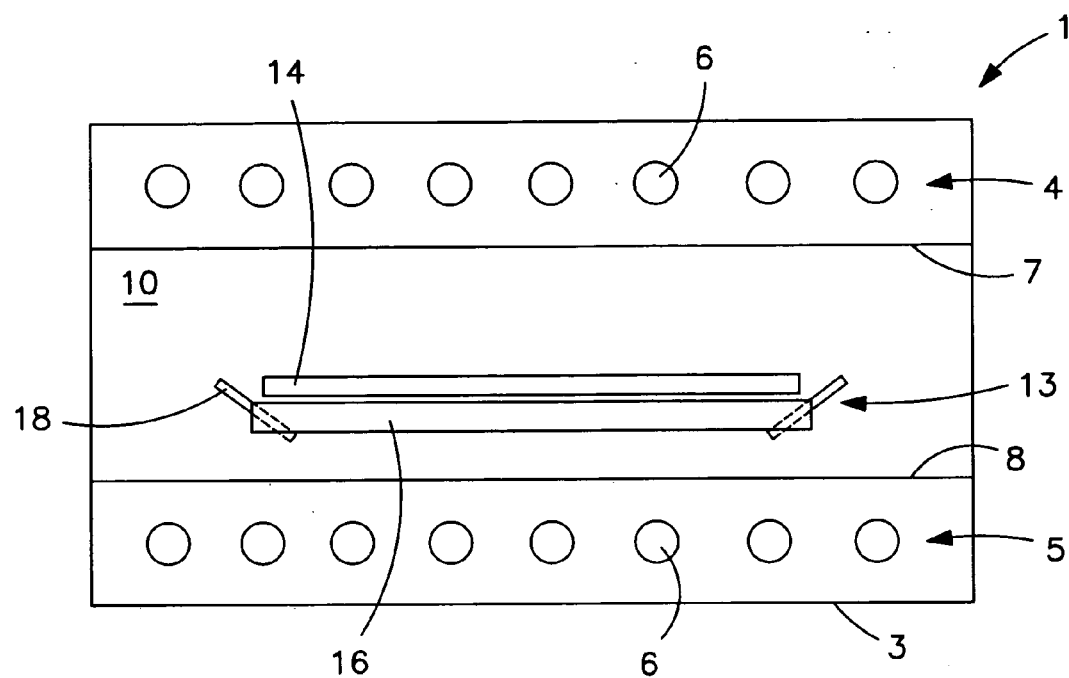
FIG. 1 shows a schematic sectional view through a rapid heating unit of the present invention.

FIG. 1 shows a sectional view through a rapid heating unit 1 that is provided with an outer housing 3. Provided within the housing 3 are upper and lower banks of lamps 4 and 5 respectively that can, for example, be formed by rod-shaped lamps 6 that extend into the plane of the drawing sheet. Provided below the upper bank of lamps 4 is a wall 7 that is made, for example, of quartz glass and that is transparent for the radiation of the lamps 6. Provided above the lower bank of lamps 5 is a corresponding transparent wall 8. Together with appropriate side walls of the housing 3, the walls 7, 8 form between them a process chamber 10.

Provided within the process chamber 10 is an ultrasonic electrode arrangement 13 for the non-contact support of a semiconductor wafer 14 within the process chamber 10.

The ultrasonic electrode arrangement 13 has a first, flat electrode 16 that has a peripheral shape, such as a circular shape, that corresponds to the substrate 14. The peripheral dimensions of the electrode 16 are slightly greater than the substrate itself. The electrode 16 is made of a material that is essentially transparent to the radiation of the lamps 6 of the lower bank of lamps 5, so that during a thermal treatment, the semiconductor wafer 14 can be heated essentially directly by the lamps 6 of the lower bank of lamps 5.

As will be explained in greater detail subsequently with reference to FIG. 5, the electrode 16 has recesses for receiving second electrodes 18, which are inclined relative to the first electrode 16. The angle formed between the electrode 16 and the electrodes 18 is preferably between 0.5 to 10°, although to facilitate illustration a larger angle is illustrated in FIG. 1. The electrodes 18 are again made of a material that is essentially transparent for the radiation of the lamps 6 of the lower bank of lamps 5 in order not to adversely affect heating of the wafer 14 by the lamps 6 of the lower bank of lamps 5. Pursuant to the presently preferred embodiment of the invention, at least three ultrasonic electrodes 18 are provided, although some other number would also be conceivable.

Figure 2A:
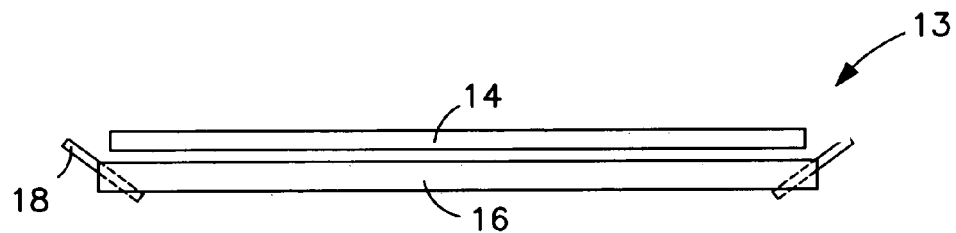
FIGS. 2a and 2b show schematic sectional views of an inventive ultrasonic electrode arrangement pursuant to a first embodiment of the invention in different operating positions.
Figure 2B:
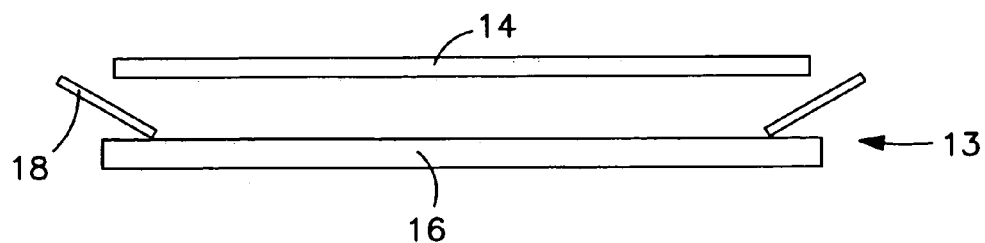

As illustrated in FIGS. 2a and 2b, the second electrodes 18 are movable in the vertical direction relative to the first electrode 16 via a non-illustrated device.

The first electrode 16 and the second electrode 18 are respectively connected to non-illustrated control devices, whereby they could also be connected with a common control device. The control device or devices can operate the ultrasonic electrodes in the short-range field and/or remote field.

The ultrasonic electrode 16 can be mounted on a heating/cooling body that is transparent for the radiation of the lamps 6 and can be in thermal contact therewith, or can itself be embodied as a heating/cooling body. In this connection, the ultrasonic electrode 16 and/or the heating/cooling body has a considerably greater thermal mass than does the wafer 14. For this purpose, means can be provided for the active heating and/or cooling of the ultrasonic electrode 16 or of the heating/cooling body that is in conductive contact therewith. For example, a fluid chamber, or a fluid conduit for allowing a heating and/or cooling fluid to pass through, can be provided in the ultrasonic electrode 16 and/or in the heating/cooling body. It is in particular possible, during different treatment stages, to conduct different fluids through the electrode 16 or the heating/cooling body, or to hold different fluids therein. By means of the fluid it would also be possible to alter the transmissivity of the electrode or of the heating/cooling body. Thus, for example at specific phases of the wafer treatment, a fluid that is essentially non-transparent for the lamp radiation can be provided so that the fluid absorbs the radiation, is heated thereby, and radiates the heat to the electrode 16 or to the heating/cooling body. A heating of a wafer 14 disposed thereabove can then be effected via the heating/cooling body. In the same manner, the fluid could also absorb thermal radiation emitted from the wafer 14 during a cooling of the wafer.

The operation of the rapid heating unit 1 will be explained in greater detail subsequently with the aid of the embodiment shown in FIGS. 1 and 2.

A semiconductor wafer 14 is transported into the process chamber 10 by means of a non-illustrated handling device, with the ultrasonic electrode arrangement being in the position shown in FIG. 2b. The ultrasonic electrodes 18 are controlled by their control device, so that they support the wafer 14 that was transported into the vicinity of the ultrasonic electrodes 18 by the handling device. In this connection, the ultrasonic electrodes 18 were operated in such a way that they supported the wafers 14 in the remote field. Due to the inclined position of the ultrasonic electrodes 18, a centering of the wafers 14 relative to the ultrasonic electrode 16 and 18 results. The handling device is removed from the process chamber 10 and the process chamber 10 is closed. Subsequently, the process chamber 10 can be filled with a suitable processing gas to the extent that this is necessary. The ultrasonic electrodes 18 are now moved vertically downwardly into the position shown in FIG. 2a, and the ultrasonic electrode 16 is controlled in such a way that it supports the wafer 14 in a non-contact manner in the short-range field.

The ultrasonic electrode 16, or a heating/cooling body in contact therewith, (subsequently reference is made only to the ultrasonic electrode 16), was first brought to an increased temperature of, for example, 650° C. This heating is possible in various ways, for example by a resistance heating, or by heat absorption from lamp radiation, for example if the ultrasonic electrode 16 is filled with a fluid that is non-transparent for the radiation of the lamps.

While the wafer 14 is held by the ultrasonic electrode 16 in the short-range field, the distance between the wafer 14 and the ultrasonic electrode is between 50 μm and 1 mm, preferably between 150 and 500 μm. A conductance of heat between these two elements is therefore essentially possible. Since the ultrasonic electrode 16 has a considerably greater thermal mass than does the wafer 14, it is rapidly heated to the vicinity of or to the temperature of the ultrasonic electrode 16. At the same time, the upper and the lower banks of lamps 4, 5 can be activated in order to additionally heat the wafer by lamp radiation, although wafers are, for the most part, generally transparent for the lamp radiation below temperatures of about 600° C. (depending upon the respective configuration of the wafer). Thus, during a starting phase of a thermal treatment, the ultrasonic electrode 16 serves as a heating body for the wafer 14 and heats the latter not only via thermal radiation emitted from the ultrasonic electrode 16 but also by heat conductance. This is possible since during the operation of the ultrasonic electrode 16 in the short-range field, an adequately small gap is formed between the wafer 14 and the ultrasonic electrode 16, thus enabling a heat conductance.

While the wafer 14 is held in the short-range field over the ultrasonic electrode 16, a static air column advantageously forms in the narrow gap between wafer and electrode. This air column does not change the process atmosphere found in the process chamber, and furthermore also does not effect any gas flows that could produce temperature inhomogeneities at the wafer 14.

During this initial heating phase, the ultrasonic electrodes 18 can be turned off, or they can be operated further, for example in the short-range field, to continue to provide a centering of the wafer.

If the wafer 14 has reached a specific target temperature, for example 600° C., the ultrasonic electrodes 18 are again moved vertically into the position shown in FIG. 2b, so that the wafer 14 is spaced from the ultrasonic electrode 16 and is essentially supported only by the ultrasonic electrodes 18. It would, of course, also be conceivable to control the ultrasonic electrode 16 in the short-range field, so that the wafer 14 is additionally supported by the ultrasonic electrode 16, and the electrodes 18 exclusively provide a centering of the wafer. The distance between the wafer 14 and the ultrasonic electrode 16 is now so great that a heat conductance between them is no longer significant. A further heating of the wafer 14 is now effected only by the upper and/or lower bank of lamps 4, 5, whereby at the latest at this point in time the ultrasonic electrode 16 should be filled with a fluid that is transparent for the radiation of the lower bank of lamps 5 to the extent that an appropriate fluid chamber is provided.

By means of the lamp radiation, the wafer 14 is now rapidly heated to its target temperature, which can, for example, be greater than 1000° C. Due to the dynamics of the lamps, a very rapid heating is possible and the heating can be adapted to a desired heating profile. If the wafer 14 is to be cooled off, either immediately after achieving a target temperature or after the wafer has been kept at the target temperature for a prescribed period of time, the ultrasonic electrodes 18 are again brought into the position show in FIG. 2a, and the ultrasonic electrode 16 is controlled in such a way that the wafer 14 is supported over the ultrasonic electrode 16 in the short-range field. At this point in time, the wafer 14 has a considerably higher temperature, for example 1100° C., than does the ultrasonic electrode, for example 650° C., so that the ultrasonic electrode 16 now functions as a cooling body. Due to the small distance between wafer 14 and ultrasonic electrode 16 in the short-range field, there is again a heat conductance between the wafer 14 and the ultrasonic electrode 16. This enables a rapid cooling of the wafer 14 not only via the thermal radiation emitted from the wafer 14 but also via direct heat conductance into the ultrasonic electrode 16. By adjusting the distance between wafer 14 and ultrasonic electrode 16, it is possible to control the cooling profile in a desired manner. If the temperature of the wafer 14 approaches or reaches the temperature of the ultrasonic electrode 16, the ultrasonic electrodes 18 are again moved into the position shown in FIG. 2b in order to space the wafer 14 from the ultrasonic electrode 16, which enables a cooling of the wafer below the temperature of the ultrasonic electrode 16. It is, of course, also possible to further lower the temperature of the ultrasonic electrode 16, for example by passing a cooling fluid through, in order to enhance the cooling of the wafer 14.

Thus, during different phases of a thermal treatment, the ultrasonic electrode 16 can be utilized as a heating or as a cooling element, even if the temperature of the ultrasonic electrode 16 is kept constant during the entire thermal treatment. If the ultrasonic electrode 16 is spaced from the wafer 14, as shown in FIG. 2b, a heat exchange between them is perceptible by radiation, but the influence thereof is relatively slight.

After the wafer 14 has again reached a lower target temperature, it is removed from the process chamber 10 by an appropriate handling device.

The use of the inventive ultrasonic electrode arrangement thus enables a non-contact support of a wafer within a process chamber 10, as well as the production of a heat conductance between the wafer 14 and the ultrasonic electrode 16 during different treatment cycles. By using the ultrasonic electrode arrangement; no foreign bodies are introduced into the process chamber 10, so that the process atmosphere is not adversely affected by the ultrasonic electrode arrangement 13 during the entire thermal treatment.

Figure 3A:
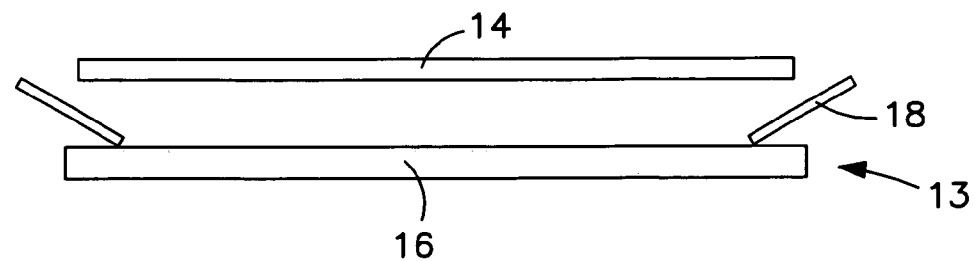
FIGS. 3a and 3b show schematic side views of an alternative ultrasonic electrode arrangement of the present invention in different operating positions.
Figure 3B:
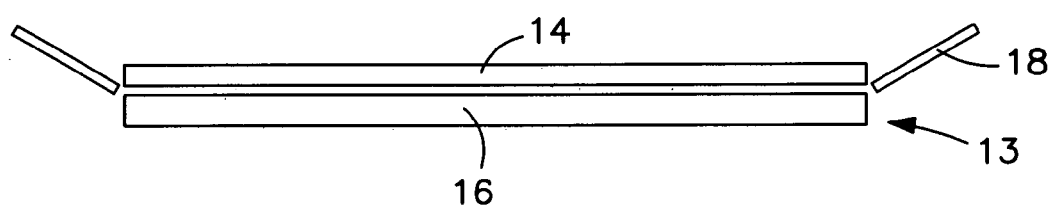

FIGS. 3a and 3b show an alternative ultrasonic electrode arrangement 13, whereby in FIGS. 3a and 3b the same reference numerals are used as is FIG. 2 to the extent that they designate the same or equivalent elements. Pursuant to FIGS. 3a and 3b, the ultrasonic electrode arrangement again has a first ultrasonic electrode 16, which essentially has a peripheral shape that corresponds to a semiconductor wafer 14 that is to be treated. Again, two ultrasonic electrodes 18 (preferably three) are provided that are angled relative to the first ultrasonic electrode 16. In contrast to the first embodiment, the first ultrasonic electrode 16 has no recesses into which the second ultrasonic electrodes 18 can be moved. Furthermore, the second ultrasonic electrodes 18 are also not movable in the vertical direction, but rather are movable laterally. In this connection, the second ultrasonic electrodes 18 are disposed on a common circular line and are movable outwardly relative to a center point of the common circular line, and in particular between the positions shown in FIG. 3a and FIG. 3b.

In the position shown in FIG. 3a, the semiconductor wafer 14 is supported essentially by the second ultrasonic electrodes 18 and is centered relative to them. If the second ultrasonic electrodes 18 are in the position shown in FIG. 3b, the semiconductor wafer 14 is supported exclusively by the first ultrasonic electrode 16. By means of the lateral movement of the ultrasonic electrodes 18, the spacing between the wafer 14 and the first ultrasonic electrode 16 can thus be altered, whereby it is possible at any point in time to also exert a support force upon the wafer 14 via the first ultrasonic electrode 16 if the first ultrasonic electrode 16 is operated in the remote field.

The ultrasonic electrode arrangement 13 of FIGS. 3a and 3b is essentially used in the same manner as the ultrasonic electrode arrangement 13 of FIGS. 1 and 2, whereby an adjustment of the spacing between the wafer 14 and the ultrasonic electrode 16 is, however, at least partially effected by a lateral movement of the ultrasonic electrodes 18. The elimination of the recesses in the ultrasonic electrode 16 enables a more homogeneous heating and/or cooling of the wafer 14.

Figure 4A:
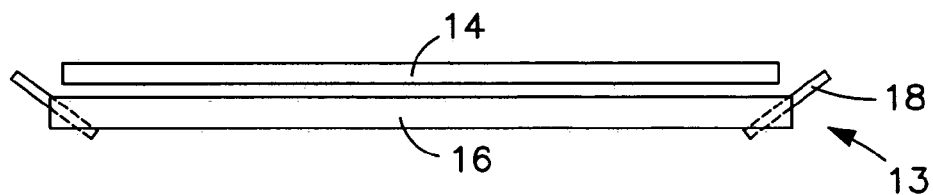
FIGS. 4a and 4b show schematic sectional views of a further embodiment of ultrasonic electrodes pursuant to the invention in different operating positions.
Figure 4B:
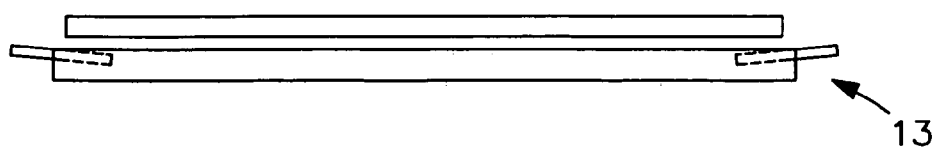

FIGS. 4a and 4b show a further embodiment of an ultrasonic electrode arrangement 13 pursuant to the present invention, whereby again the same reference numerals are used as with the first embodiment to the extent that they represent the same or equivalent elements.

The ultrasonic electrode arrangement 13 of FIGS. 4a and 4b again has a first ultrasonic electrode 16 having a peripheral shape corresponding to the wafer 14. Provided in the first ultrasonic electrode 16 are recesses for receiving a plurality of second ultrasonic electrodes 18, preferably at least three. For example, the ultrasonic electrodes 16 and 18 can be arranged as illustrated in the plan view of FIG. 5.

The second ultrasonic electrodes 18 are pivotably mounted on the first ultrasonic electrode 16 and can be pivoted by a suitable control device. Two different positions of the second ultrasonic electrodes 18 relative to the first ultrasonic electrode 16 are illustrated in FIGS. 4a and 4b. By changing the angle, the distance between the wafer 14 and the first ultrasonic electrode 16 can be altered. Although this is not illustrated in FIGS. 4a and 4b, the ultrasonic electrodes 18 can be pivoted to such an extent that they form an essentially flat plane with the first ultrasonic electrode 16.

The ultrasonic electrode arrangement of FIGS. 4a and 4b is utilized in essentially the same manner as the ultrasonic electrode arrangement of FIGS. 1 and 2, whereby an adjustment of the spacing of the first electrode 16 relative to the wafer 14 can be effected at least partially via pivoting of the second ultrasonic electrodes 18.

Figure 5:
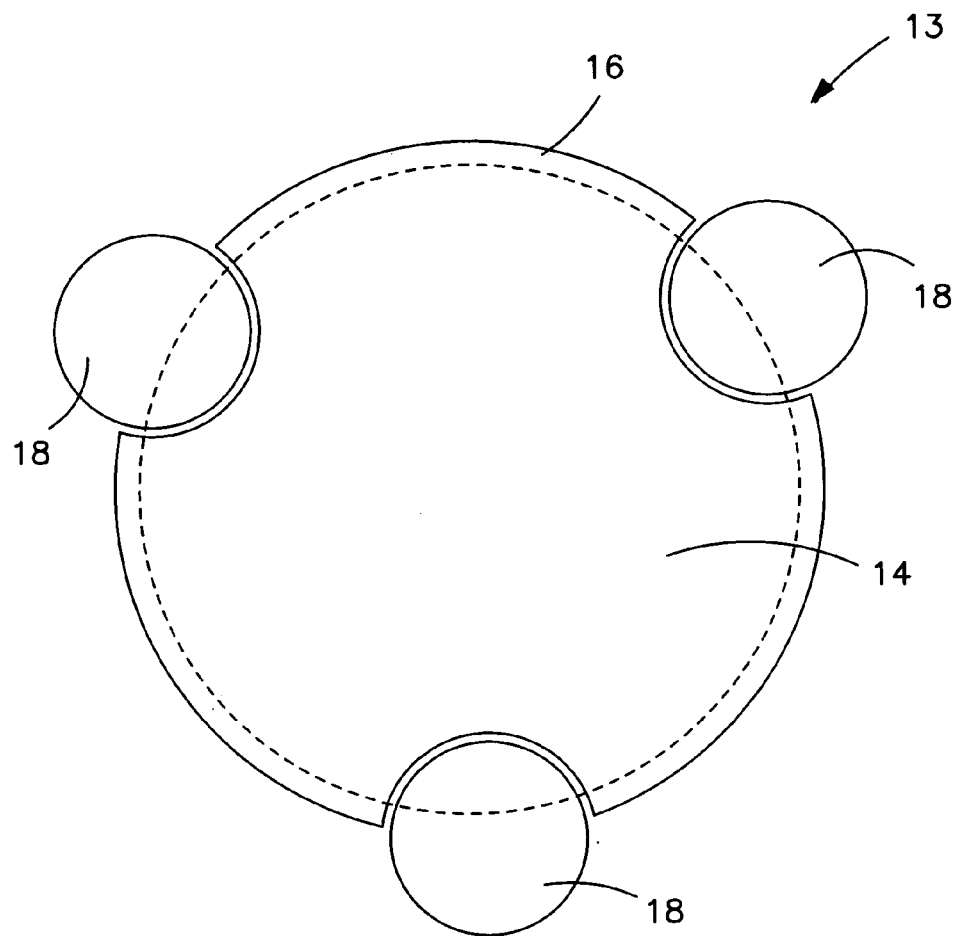
FIG. 5 shows a schematic plan view onto an ultrasonic electrode arrangement of one embodiment of the invention.

FIG. 5 is a plan view onto an ultrasonic electrode arrangement pursuant to FIGS. 1 and 2 or FIG. 4. In this plan view, one can see an ultrasonic electrode 16 having recesses for receiving three second ultrasonic electrodes 18. The ultrasonic electrodes can, as with the embodiment of FIGS. 1 and 2, be movable vertically into or out of the recesses, or as with the embodiment of FIG. 4, can be pivotably mounted within the recesses. A wafer 14 is furthermore indicated in the plan view of FIG. 5 by a dashed line.

FIG. 6 shows a further, alternative form of an ultrasonic electrode arrangement 13, whereby in FIG. 6 again the same reference numerals are used as with the previous embodiments.

Figure 6:
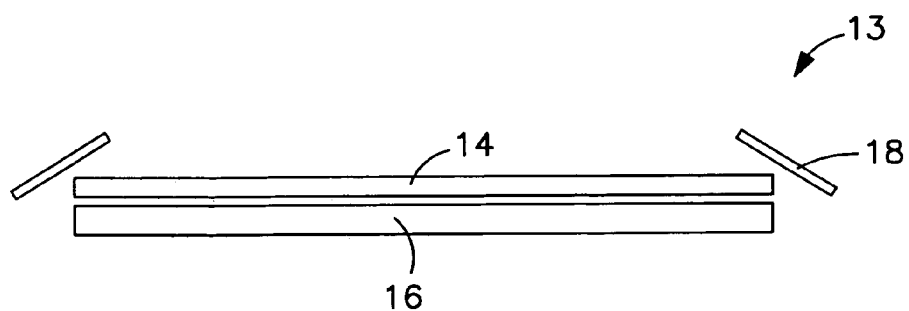
FIG. 6 shows a schematic side view of an alternative ultrasonic electrode arrangement pursuant to the invention.

The embodiment of FIG. 6 provides a first ultrasonic electrode 16 having a peripheral shape corresponding to the peripheral shape of the wafer 14. Furthermore, at least one second ultrasonic electrode 18 is provided that is angled relative to the first ultrasonic electrode 16. This second ultrasonic electrode 18 can have a continuous annular shape or a plurality, preferably at least three, of ultrasonic electrodes 18 that are disposed on a peripheral circle can be provided. The ultrasonic electrodes 18 have their radiation surfaces directed toward the first ultrasonic electrode 16, and are disposed above the first ultrasonic electrode 16. The ultrasonic electrodes 18 are movable vertically or laterally in order to enable a semiconductor wafer 14 to be received between the ultrasonic electrodes 18. The semiconductor wafer 14 can be supported either by the ultrasonic electrode 16 or alternatively also by the ultrasonic electrodes 18, whereby in this case the wafer is essentially suspended on the ultrasonic electrodes 18 via ultrasound. However, this is possible only if the ultrasonic electrodes 18 are operated in the so-called remote field.

An adjustment of the spacing between wafer 14 and the ultrasonic electrode 16 can be effected either by a movement of the ultrasonic electrodes 16 or 18 or by appropriate control of the first ultrasonic electrode 16 (switching between remote field and short-range field) or of the ultrasonic electrodes 18.

The ultrasonic electrode arrangement 13 of FIG. 6 is used in the same manner as the ultrasonic electrode arrangement 13 of FIG. 1.

Figure 7:
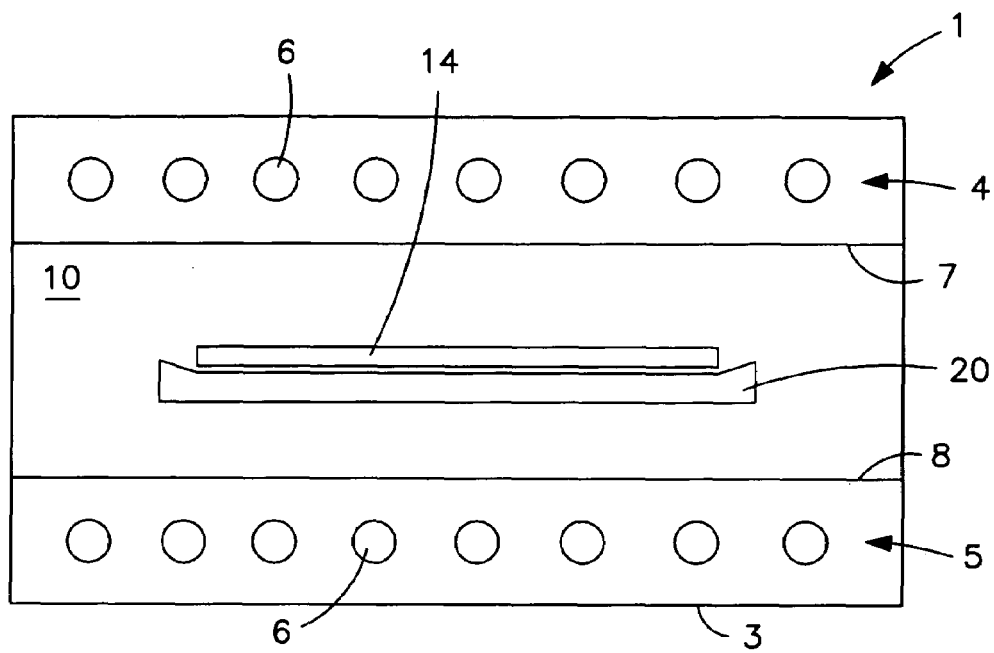
FIG. 7 shows a schematic sectional view through a rapid heating unit having an ultrasonic electrode pursuant to a further embodiment of the invention.
Figure 8:
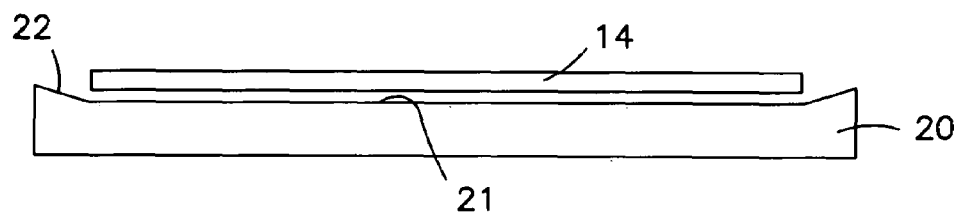
FIG. 8 shows an enlarged sectional illustration of the ultrasonic electrode of FIG. 7.

FIG. 7 again shows a cross-sectional illustration of a rapid heating unit 1 having a housing 3 and upper and lower banks of lamps 4, 5. Upper and lower quartz windows 7, 8 are again provided for the formation of a process chamber 10. However, instead of an ultrasonic electrode arrangement 13 that is comprised of at least two separate ultrasonic electrodes, pursuant to FIG. 7 only a single ultrasonic electrode 20 is provided for the support of a wafer 14 in the process chamber 10. The ultrasonic electrode 20, which is shown enlarged in FIG. 8, has a first, upwardly facing ultrasonic radiation surface 21 that has a peripheral shape corresponding to the wafer 14. Adjoining this planar radiation surface 21 radially outwardly is a second ultrasonic radiation surface 22 that is angled relative thereto. The angle between the planar radiation surface 21 and the angled radiation surface 22 is preferably between 0.5 and 10°, although a larger angle is illustrated in FIG. 8. The ultrasonic radiation surfaces 21, 22 can be controlled either together or also separately by a suitable control unit. In contrast to the preceding embodiments, the planar ultrasonic radiation surface 21, and the ultrasonic radiation surface 22 that is angled relative thereto, are stationary relative to one another during the entire operation of the apparatus. A change in spacing between the wafer 14 and the planar ultrasonic radiation surface 21 is effected exclusively via an appropriate control of the respective ultrasonic radiation surfaces and an appropriate switching between a remote field and short-range field operation.

The ultrasonic electrode 20 is again embodied as a heating/cooling body, or is in thermally conductive contact with such a body. As with the first embodiment, suitable means can be provided for the heating/cooling of the ultrasonic electrode 20.

The ultrasonic electrode 20 is essentially used in the same manner as are the previously described ultrasonic electrodes, whereby an adjustment of the spacing between wafer 14 and ultrasonic electrode is effected via an appropriate control thereof, as mentioned.

Figure 9:
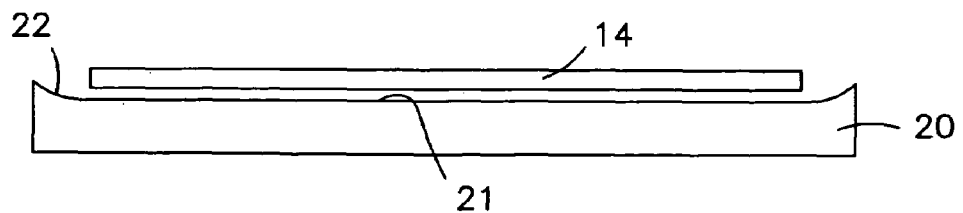
FIG. 9 shows an alternative embodiment of an ultrasonic electrode.

FIG. 9 shows an alternative embodiment of a one-piece ultrasonic electrode 20, whereby the same reference numerals are used as in FIG. 8. The ultrasonic electrode 20 again has a planar ultrasonic radiation surface 21 that corresponds to the peripheral shape of the wafer 14. Radially adjoining this ultrasonic radiation surface is an upwardly curved ultrasonic radiation surface 22 that by appropriate control effects a centering of the wafer 14 relative to the ultrasonic electrode 20.

Figure 10:
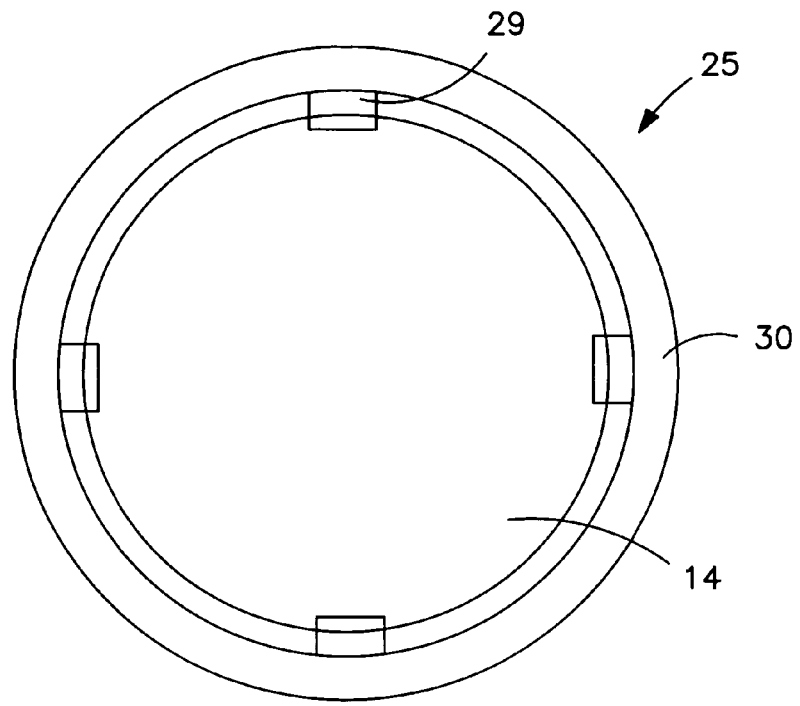
FIG. 10 shows a plan view onto a temperature-compensation ring having ultrasonic electrodes mounted thereon pursuant to an embodiment of the invention.
Figure 11A:
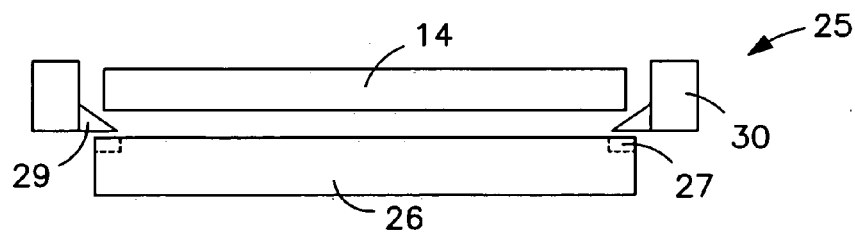
FIGS. 11a and 11b show sectional views of ultrasonic electrode arrangements having a compensation ring in different operating positions.

FIGS. 10 and 11 show an alternative ultrasonic electrode arrangement 25. The ultrasonic electrode arrangement 25 has a first ultrasonic electrode 26 that has a peripheral shape corresponding to the peripheral shape of a wafer 14. Provided in the ultrasonic electrode 26 are four recesses 27 that are uniformly distributed about the periphery. The function of the recesses 27 will be explained in greater detail subsequently.

The ultrasonic electrode arrangement 25 furthermore has four second ultrasonic electrodes 29, which are provided with radiation surfaces that are inclined relative to the first ultrasonic electrode 26. The four second ultrasonic electrodes 29 are mounted on the inner periphery of a temperature-compensation ring 30. The temperature-compensation ring 30, together with the ultrasonic electrodes 29, is vertically movable, although it would, of course, also be possible to make the temperature-compensation ring 30 stationary and to make the ultrasonic electrode 26 vertically movable.

Figure 11B:
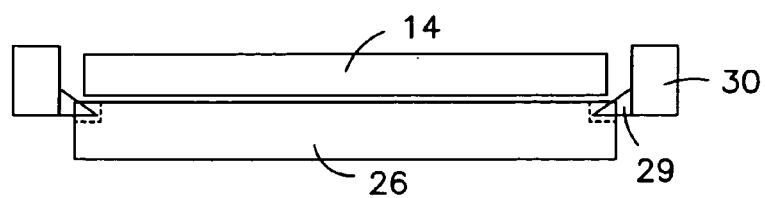

The second ultrasonic electrodes 29 are aligned with the recesses 27 of the first ultrasonic electrode 26 and, as shown in FIG. 11b, can be moved into the recesses 27.

In this way, it is possible to adjust the spacing between a wafer 14 and the ultrasonic electrode 26.

The ultrasonic electrode arrangement 25 is essentially used in the same manner as is the ultrasonic electrode arrangement of FIG. 1.

Figure 12:
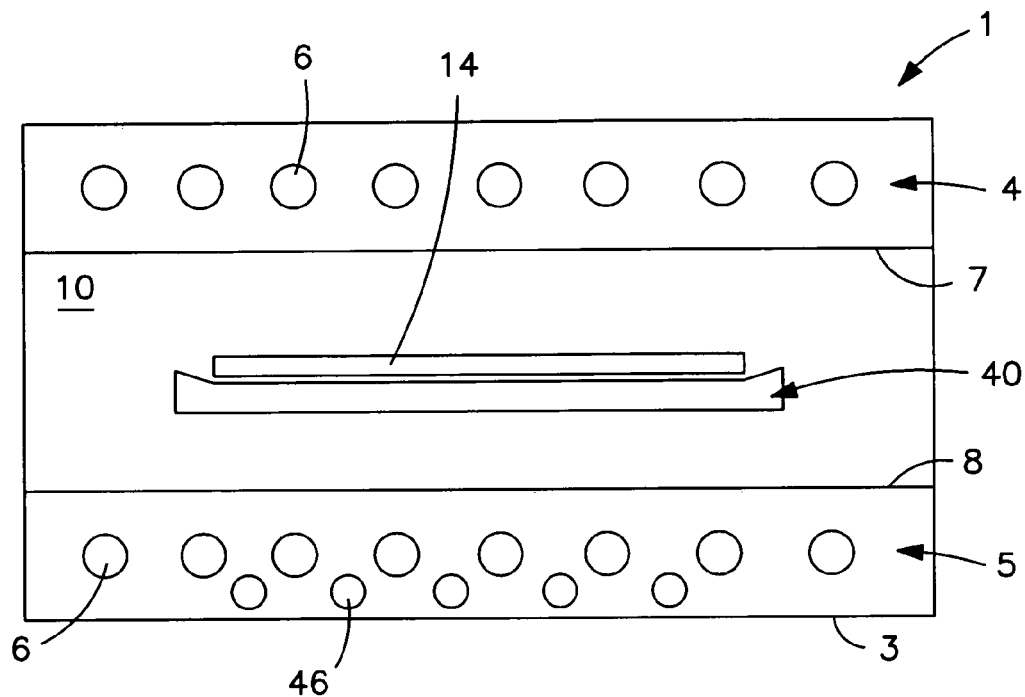
FIG. 12 shows a sectional view through a rapid heating unit having an ultrasonic electrode pursuant to a further embodiment of the invention.
Figure 13:
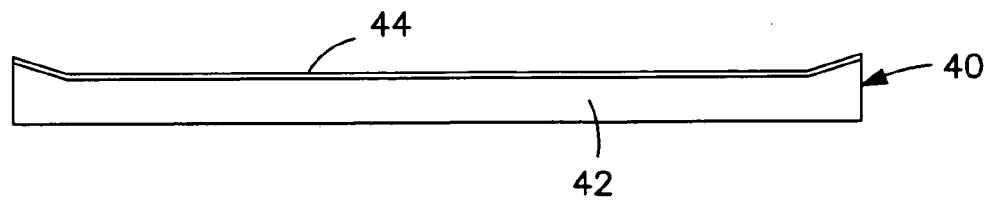
FIG. 13 shows an enlarged illustration of an ultrasonic electrode pursuant to a further embodiment of the present invention.

FIGS. 12 and 13 show a further embodiment of the present invention. In FIGS. 12 and 13 the same reference numerals are used as with the preceding embodiments to the extent that they reference identical or similar elements.

FIG. 12 shows a schematic sectional view of a rapid heating unit 1 having a housing 3 and upper and lower banks of lamps 4, 5. Provided in the housing are upper and lower quartz windows 7, 8 that, as with the first embodiment, form a process chamber 10. Provided within the process chamber 10 is an ultrasonic electrode 40, which is illustrated enlarged in FIG. 13. The ultrasonic electrode 10 comprises a main body 42 that is in the form of a heating/cooling body. Applied to the main body 42 is a coating 44 that serves as the actual ultrasonic electrode. The main body 42 essentially has the shape of the ultrasonic electrode 20 of FIG. 8, together with an appropriate coating 44. However, it is also possible to provide a configuration having separate ultrasonic electrodes.

The main body 42, as well as the coating 44, are made of a material that is transparent for the radiation of the lamps 6 of the bank of lamps 4, 5.

Provided in the region of the lower bank of lamps 5 is a plurality of lamps 46 that differ from the lamps 6 of the bank of lamps 5 and which radiate with a different wavelength. The material of the main body 42 and/or of the coating 44 of the ultrasonic electrode 40 is not transparent for the radiation of the lamps 46, and can therefore be heated by the radiation of the lamps 46. The lamps 46 thus provide the possibility for an initial heating of the ultrasonic electrode 40 during a heating phase of a thermal treatment of a wafer 14. The operation of the rapid heating unit 1 essentially corresponds to the operation of the rapid heating unit 1 of FIG. 1, whereby an initial heating of the ultrasonic electrode 40 is essentially effected by the lamps 46 in order to bring the wafer 14 to a first target temperature of, for example, 650° C.

In the previously described embodiments, it is additionally possible to provide devices for rotating the wafer 14 within the process chamber. In this connection, a rotation can be induced by rotating one or more of the ultrasonic electrodes. Furthermore, the ultrasonic electrodes can be controlled in such a way that they produce a rotating sound field in order to rotate the wafer. A gas stream that is directed onto a surface of the wafer 14 or onto the rim of the wafer could also effect a corresponding rotation. In this connection, oppositely directed gas nozzles can be used for the acceleration and slowing down of the wafer 14. Instead of the inclined ultrasonic electrodes, a gas stream can also be used for the lateral positioning or centering. Appropriate gas nozzles can, for example, be integrated in a heating/cooling body, the electrodes, or the compensation ring, or can be separately provided.

The invention has been explained with the aid of special embodiments of the invention, without thereby being limited to these special embodiments. In particular, it is possible to replace or combine features of the various embodiments with one another to the extent that they are compatible.

The specification incorporates by reference the disclosure of German priority document 102 60 672.2 filed Dec. 23, 2002 and PCT/EP2003/013388 filed Nov. 28, 2003.

The present invention is, of course, in no way restricted to the specific disclosure of the specification and drawings, but also encompasses any modifications within the scope of the appended claims.

The invention claimed is:

1. A method of thermally treating disk-shaped substrates in a rapid heating unit having at least one first radiation source, which is spaced from a given substrate, for heating the substrate, including the steps of
heating the substrate, and
cooling the substrate in a cooling phase that follows the heating phase, wherein during at least a portion of the cooling phase, the substrate is supported at a distance from 50 μm to 1 mm via ultrasonic levitation from a heating/cooling plate.

2. A method according to claim 1, wherein said distance is between 150 and 500 μm.

3. A method according to claim 1, wherein said heating/cooling plate is provided with at least one first ultrasonic electrode.

4. A method according to claim 3, wherein said at least one first ultrasonic electrode has at least one flat radiation surface that essentially corresponds to a shape and size of said substrate.

5. A method according to claim 4, wherein said at least one first ultrasonic electrode has at least one second radiation surface that is inclined relative to the flat radiation surface thereof and by means of which the substrate is supported in a prescribed lateral position.

6. A method according to claim 3, wherein at least one second ultrasonic electrode is provided and is angled and/or movable relative to said at least one first ultrasonic electrode.

7. A method according to claim 6, wherein the substrate is supported by the at least one second ultrasonic electrode in a prescribed lateral position.

8. A method according to claim 1, wherein during an initial portion of the heating/cooling phase, the substrate is spaced from the heating/cooling plate at a distance of between 50 μm and 1 mm, and wherein during a following portion of the cooling phase, the substrate is supported at a greater distance relative to the heating/cooling plate.

9. A method according to claim 8, wherein the substrate is spaced from the heating/cooling plate at a distance of between 50 μm until the substrate has essentially reached the temperature of the heating/cooling plate.

10. A method according to claim 1, wherein the heating/cooling plate has a thermal mass that is considerably greater than that of the substrate.

11. A method according to claim 1, wherein the temperature of the heating/cooling plate is controlled.

12. A method according to claim 1, wherein the heating/cooling plate is essentially transparent for the radiation of the at least one first radiation source.

13. A method according to claim 12, wherein for heating the heating/cooling plate, a fluid that is essentially opaque for the radiation of the at least one first radiation source is introduced into a chamber of the heating/cooling plate.

14. A method according to claim 12, wherein during a direct radiation heating of the substrate via the at least one first radiation source, a fluid that is essentially transparent for the radiation of the radiation source is introduced into a chamber of the heating/cooling plate.

15. A method according to claim 9, wherein for a cooling of the heating/cooling plate, a fluid is conveyed through a chamber of the heating/cooling plate.

16. A method according to claim 1, wherein the heating/cooling plate is essentially opaque for thermal radiation originating from the substrate.

17. A method according to claim 1, wherein at least one second radiation source is provided on a side of a heating/cooling plate that faces away from the substrate, wherein the heating/cooling plate is essentially opaque for the radiation of the at least one second radiation source, and wherein the heating/cooling plate is heated at least partially by the at least one second radiation source during a thermal treatment.

18. A method according to claim 17, wherein the at least one second radiation source has a different wave length than does the at least one first radiation source.

19. A method according to claim 1, wherein during at least a portion of the heating phase, the substrate is spaced from the heating/cooling plate by a distance of between 50 μm and 1 mm.

20. A method according to claim 19, wherein during an initial portion of the heating phase, the substrate is spaced from the heating/cooling plate by a distance of between 50 μm and 1 mm, and wherein during a following portion of the heating phase, the substrate is supported relative to the heating/cooling plate at a greater distance.

21. A method according to claim 1, wherein at least during portions of a thermal treatment the substrate is rotated.

22. A method according to claim 21, wherein the substrate is rotated by a rotating noise field, by rotation of the heating/cooling plate and/or by rotation of at least one ultrasonic electrode, or by a gas stream directed onto the substrate.

23. A method of thermally treating disk-shaped substrates in a rapid heating unit, including the steps of:
heating a given substrate, in a heating phase, via a radiation source that is spaced from the substrate; and
cooling the substrate in a cooling phase that follows the heating phase, wherein during thermal treatment the substrate is supported in the rapid heating unit via ultrasonic levitation.

24. A method according to claim 23, wherein a distance between a first ultrasonic electrode and the substrate is altered during the thermal treatment.

25. A method according to claim 24, wherein at least a portion of the cooling phase, the substrate is spaced from the heating/cooling plate by a distance of between 50 µm and 1 mm, in particular between 150 and 500 µm.

26. A method according to claim 25, wherein the heating/cooling plate is provided with at least one first ultrasonic electrode.

27. A method according to claim 26, wherein the at least one first ultrasonic electrode has at least one flat radiation surface that essentially corresponds to a shape and size of a substrate.

28. A method according to claim 27, wherein the at least one first ultrasonic electrode has at least one second radiation surface that is inclined relative to the flat radiation surface thereof and by means of which the substrate is supported in a prescribed lateral position.

29. A method according to claim 26, wherein at least one second ultrasonic electrode is provided that is angled and/or movable relative to the at least one first ultrasonic electrode.

30. A method according to claim 29, wherein the substrate is supported in a prescribed lateral position by the at least one second ultrasonic electrode.

31. A method according to claim 23, wherein during an initial portion of the cooling phase, the substrate is spaced from a heating/cooling plate by a distance of between 50 µm and 1 mm, and wherein during a following portion of the cooling phase, the substrate is supported relative to the heating/cooling phase at a greater distance.

32. A method according to claim 23, wherein the substrate is spaced from a heating/cooling plate at a distance of between 50 µm and 1 mm until the substrate has essentially reached the temperature of the heating/cooling plate.

33. A method according to claim 23, wherein a heating/cooling plate is provided that has a thermal mask that is considerably greater than that of the substrate.

34. A method according to claim 23, wherein a heating/cooling plate is provided, and wherein the temperature of the heating/cooling plate is controlled.

35. A method according to claim 23, wherein a heating/cooling plate is provided that is essentially transparent for the radiation of the radiation source.

36. A method according to claim 35, wherein for a heating/cooling, a fluid that is essentially opaque for the radiation of the radiation source is introduced into a chamber of the heating/cooling plate.

37. A method according to claim 35, wherein during a direct radiation heating of the substrate via the radiation source, a fluid that is essentially transparent for the radiation of the radiation source is conveyed into a chamber of the heating/cooling plate.

38. A method according to 37, wherein for a cooling of the heating/cooling plate, a fluid is conveyed through a chamber of the heating/cooling plate.

39. A method according to claim 23, wherein a heating/cooling plate is provided, and wherein the heating/cooling plate is essentially opaque for thermal radiation originating from the substrate.

40. A method according to claim 23, wherein a heating/cooling plate is provided, wherein at least one second radiation source is provided on a side of a heating/cooling plate that faces away from the substrate, wherein the heating/cooling plate is essentially opaque for the radiation of the at least one second radiation source, and wherein the heating/cooling plate is at least partially heated by the at least one second radiation source during a thermal treatment.

41. A method according to claim 40, wherein the at least one second radiation source has a different wave length than does the first radiation source.

42. A method according to claim 23, wherein during at least a portion of the heating phase, the substrate is spaced from a heating/cooling plate by a distance of about 50 µm and 1 mm.

43. A method according to claim 42, wherein during an initial portion of the heating phase, the substrate is spaced from the heating/cooling plate by a distance of 50 µm and 1 mm, and wherein during a following portion of the heating phase, a substrate is supported relative to the heating/cooling plate at a greater distance.

44. A method according to claim 23, wherein during at least portions of a thermal treatment, the substrate is rotated.

45. A method according to claim 44, wherein the substrate is rotated by a rotating sound field, by rotation of the heating/cooling plate and/or by rotation of at least one ultrasonic electrode, or by a gas stream that is directed onto the substrate.

46. An apparatus for thermally treating disk-shaped substrates, comprising:
a rapid heating unit having at least one first radiation source spaced from a given substrate for heating the substrate; and
at least one first ultrasonic electrode for supporting the substrate in the rapid heating unit in a non-contact manner.

47. An apparatus according to claim 46, wherein the at least one first ultrasonic electrode has at least one flat radiation surface that essentially corresponds to a shape and size of the substrate.

48. An apparatus according to claim 46, which includes a control device for operating the at least one first ultrasonic electrode in the short-range field in order to support the substrate above the at least one first ultrasonic electrode at a distance of between 50 µm and 1 mm, in particular between 150 and 500 µm.

49. An apparatus according to claim 46, wherein at least one ultrasonic electrode forms a heating/cooling plate or is in thermally conductive contact with a heating/cooling plate, and wherein the heating/cooling plate has a thermal mass that is considerably greater than that of the substrate.

50. An apparatus according to claim 49, wherein the at least one first ultrasonic electrode is a coating on the heating/cooling plate.

51. An apparatus according to claim 47, wherein the at least one first ultrasonic electrode has at least one second radiation surface that is inclined relative to the flat radiation surface.

52. An apparatus according to claim 46, wherein at least one second ultrasonic electrode is provided that is angled and/or is movable relative to at least one first ultrasonic electrode.

53. An apparatus according to claim 52, wherein the at least one second ultrasonic electrode has a ring-shaped form.

54. An apparatus according to claim 51, wherein at least three second ultrasonic electrodes are disposed on a circular line.

55. An apparatus according to claim 54, wherein the second ultrasonic electrodes are radially movable relative to a center point of the circular line and/or are movable vertically.

56. An apparatus according to claim 52, which includes a control device for controlling the at least one second ultrasonic electrode in such a way that it generates a rotating sound field.

57. An apparatus according to claim 46, wherein at least one second ultrasonic electrode is provided, and wherein the at least one second ultrasonic electrode is disposed on a compensation ring that radially surrounds the substrate.

58. An apparatus according to claim 57, wherein the at least one second ultrasonic electrode is inclined relative to the plane of the compensation ring.

59. An apparatus according to claim 49, which includes a device for controlling the temperature of the heating/cooling plate.

60. An apparatus according to claim 49, wherein the heating/cooling plate is essentially transparent for the radiation of the at least one first radiation source, and/or wherein the heating/cooling plate is essentially opaque for thermal radiation originating from the substrate.

61. An apparatus according to claim 49, wherein at least one second radiation source is provided on a side of the heating/cooling plate that faces away from the substrate, and wherein the heating/cooling plate is essentially opaque for the radiation of the at least one second radiation source.

62. An apparatus according to claim 61, wherein the at least one second radiation source has a wavelength that is different than that of the at least one first radiation source.

63. An apparatus according to claim 46, wherein a device is provided for generating a rotational impulse for the substrate.

64. An apparatus according to claim 63, wherein the device is provided with a control device for generating a rotating sound field.

65. An apparatus according to claim 63, wherein a mechanism is provided for a rotation of a heating/cooling plate and/or at least one ultrasonic electrode about a prescribed point of rotation.

66. An apparatus according to claim 63, wherein at least one gas nozzle is directed onto the substrate.

67. An apparatus according to claim 66, wherein the at least one gas nozzle is disposed in the heating/cooling plate, in an ultrasonic electrode, and/or in a compensation ring that surrounds the substrate.

* * * * *